(12) United States Patent
Bourgin

(10) Patent No.: US 7,370,301 B2
(45) Date of Patent: *May 6, 2008

(54) METHOD AND APPARATUS FOR MIXING STATIC LOGIC WITH DOMINO LOGIC

(75) Inventor: Bernard Bourgin, San Diego, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 441 days.

This patent is subject to a terminal disclaimer.

(21) Appl. No.: 11/015,317

(22) Filed: Dec. 17, 2004

(65) Prior Publication Data

US 2006/0136852 A1    Jun. 22, 2006

(51) Int. Cl.
G06F 17/50     (2006.01)
(52) U.S. Cl. .......................................... 716/6
(58) Field of Classification Search ...................... 716/6
See application file for complete search history.

(56) References Cited

U.S. PATENT DOCUMENTS

| | | | |
|---|---|---|---|
| 5,041,742 | A |  8/1991 | Carbonaro |
| 5,524,082 | A |  6/1996 | Horstmann et al. |
| 5,774,369 | A |  6/1998 | Horstmann et al. |
| 5,852,373 | A | 12/1998 | Chu et al. |
| 5,880,608 | A |  3/1999 | Mehta et al. |
| 5,883,529 | A |  3/1999 | Kumata et al. |
| 5,903,467 | A |  5/1999 | Puri et al. |
| 5,930,148 | A |  7/1999 | Bjorksten et al. |
| 5,973,529 | A * | 10/1999 | Chappell et al. ............ 327/200 |
| 5,990,706 | A | 11/1999 | Matsumoto et al. |
| 6,018,621 | A |  1/2000 | Puri et al. |
| 6,035,110 | A |  3/2000 | Puri et al. |
| 6,208,907 | B1 * |  3/2001 | Durham et al. ............. 700/121 |
| 6,209,121 | B1 |  3/2001 | Goto |
| 6,212,670 | B1 |  4/2001 | Kaviani |
| 6,405,347 | B1 |  6/2002 | McBride |
| 6,499,129 | B1 | 12/2002 | Srinivasan et al. |
| 6,529,861 | B1 * |  3/2003 | Patra et al. .................... 703/14 |

(Continued)

OTHER PUBLICATIONS

D. Harris, "Skew-Tolerant Circuit Design", Morgan Kaufman Publishers, San Francisco, CA 2001, Chapter 1, pp. 1-31 and section 3.2., pp. 79-95.

(Continued)

Primary Examiner—Jack Chiang
Assistant Examiner—Brandon Bowers
(74) Attorney, Agent, or Firm—Lisa K. Jorgenson; William J. Kubida

(57) ABSTRACT

An automatic method for assigning the clock phases on a domino datapath embedding static gates includes replacing domino cells on non-critical paths by a static equivalent cell, delaying the clock arrival on domino gates driven by static signals, ensuring that critical data never waits for the clock in the domino pipeline, ensuring that a domino data never goes to precharge, and therefore is lost before it is consumed, ensuring that the domino datapath operates at any speed below the maximum operating speed, ensuring that domino signals leaving the design through primary outputs of a static block are latched to prevent the precharge to overwrite the evaluated results, providing an optimal solution in terms of performance, area and power, defining some constraints that are checked and enforced by the downstream tools in order to guaranty the proper functionality of the design.

20 Claims, 15 Drawing Sheets

U.S. PATENT DOCUMENTS

| | | |
|---|---|---|
| 6,549,038 B1 | 4/2003 | Sechen et al. |
| 6,556,962 B1 | 4/2003 | Patra |
| 6,721,926 B2 | 4/2004 | Wang et al. |
| 6,851,095 B1 | 2/2005 | Srinivasan et al. |
| 6,854,096 B2 | 2/2005 | Eaton et al. |
| 7,000,202 B1 | 2/2006 | Srinivasan et al. |
| 7,117,461 B1 | 10/2006 | Srinivasan et al. |
| 2002/0178432 A1 | 11/2002 | Kim et al. |
| 2003/0145288 A1 | 7/2003 | Wang et al. |
| 2004/0103377 A1 | 5/2004 | Eaton et al. |
| 2004/0155678 A1 | 8/2004 | Anderson et al. |
| 2005/0278681 A1 | 12/2005 | Hossain et al. |
| 2006/0120189 A1 | 6/2006 | Beerel et al. |
| 2006/0253808 A1 | 11/2006 | Zounes |

OTHER PUBLICATIONS

K. Bernstein et al., "High Speed CMOS Design Styles", Kluwer Academic Publishers, Boston, 1998, pp. 91-131.

* cited by examiner

BUFFER CLOCKED BY O2:
1/4 PERIOD PENALTY

BUFFER CLOCKED BY LATE O1:
LIMITED PENALTY

BUFFER CLOCKED BY EARLY O2:
LIMITED PENALTY

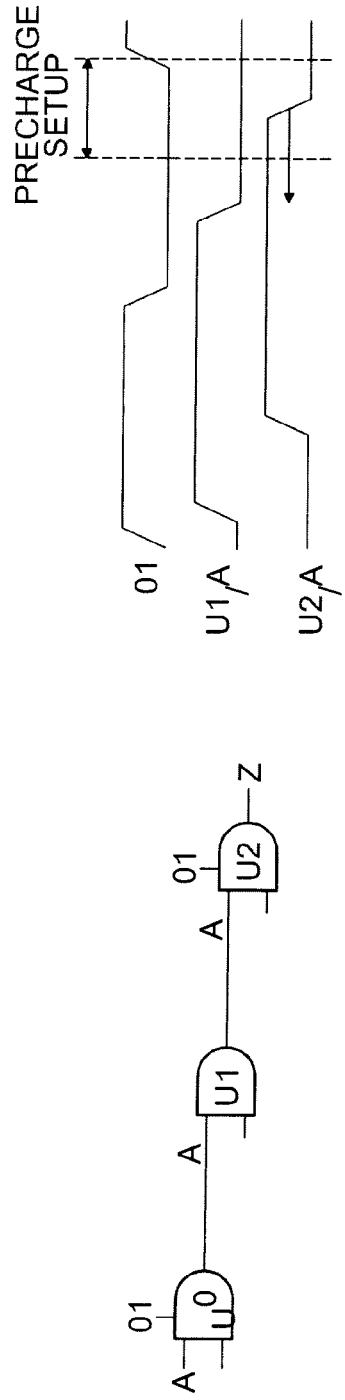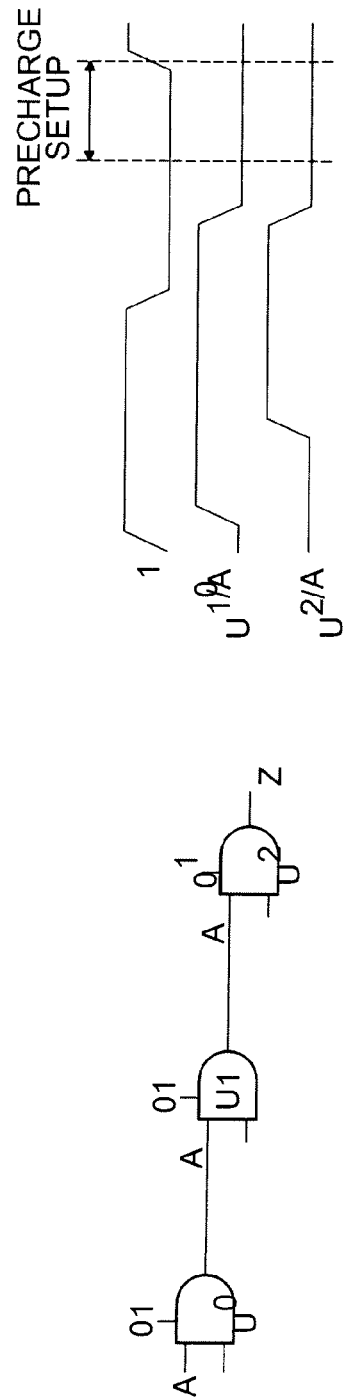
Fig. 7A
Fig. 7B

METHOD AND APPARATUS FOR MIXING STATIC LOGIC WITH DOMINO LOGIC

CROSS REFERENCE TO RELATED PATENT APPLICATIONS

The present invention is related to the subject matter of U.S. patent application Ser. No. 10/248,721 for: "Method for Synthesizing Domino Logic Circuits" and U.S. patent application Ser. No. 11/015,513 for: "Dynamic Phase Assignment Optimization Using Skewed Static Buffers In Place Of Dynamic Buffers" and is further related to the subject matter of U.S. patent application Ser. No. 11/015,512 for: "Method To Unate A Design For Improved Synthesizable Domino Logic Flow", all of which are filed concurrently and assigned to STMicroelectronics, Inc. , Carrollton, Tex. and the disclosures of which are herein specifically incorporated in their entirety by this reference.

FIELD OF THE INVENTION

The present invention is related to logic designs involving both static and domino logic cells, and more particularly, to a method of automatically and optimally assigning clock phases to a domino datapath embedding static logic.

BACKGROUND OF THE INVENTION

Domino logic is a precharged, non-inverting family of CMOS logic that uses multiple clock phases to achieve high-speed operation. Domino logic is faster than standard static logic, but it is more difficult to use because of its increased complexity, primarily in the clocking network. Using dynamic logic, such as domino logic, is a well-known way of gaining speed in high performance designs. However, dynamic logic tends to use more integrated circuit die area and consumes more power as compared to static logic.

Typically domino logic operates in two phases: precharge and evaluate. During the precharge phase, when the clock is low, the output of the cell goes low. During the evaluate phase, when the clock is high, the output of the cell can only transition from a low to a high value. This is in contrast to standard static logic typically used with CMOS technology. In static logic designs, the output of the cell can rise or fall, depending on the input conditions, during normal operation.

The clocking scheme consists of three or more skewed clock phases operating at the same frequency. Typically, the clock phases have a balanced duty cycle and are equally skewed in order to maximize their overlap, since the tolerance to the clock uncertainty increases with the phase overlap.

What is desired is a method for replacing domino logic cells with smaller, less complicated, and lower-power static cells in selected parts of a logic circuit design that are not impacted by the lower operating speeds of the static cells.

SUMMARY OF THE INVENTION

According to the method of the present invention, an automated method for achieving the optimal phase assignment of a datapath mixing domino and static gates, ensuring that the data is effectively propagated along the datapath without being lost nor delayed at the output, ensuring also that the design will operate at any speed, up to the maximum speed, ensuring finally that domino and static gates are used in the most cost-effective way.

The method of the present invention includes using a script that takes a placed design netlist mixing domino and static gates and performs a Static Timing Analysis (using Synopsys Primetime®) to connect optimally the clock input of each domino gate, to revert some static gates to domino gates or to insert domino buffers whenever it is needed to ensure the proper behavior of the design. The script also drives a standard cell placer (Synopsys Physical Compiler®) to perform the required netlist changes mentioned above.

The method of the present invention further includes performing an additional minimum data overlap check.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 7(a) is a combined timing and logic gate diagram in which the speed of the precharge path is increased by sizing up a static cell, in order to avoid a precharge setup violation;

FIG. 7(b) is a combined timing and logic gate diagram as in FIG. 7(a) in which the static gate in the precharge path has been reverted to a domino gate;

DESCRIPTION OF A REPRESENTATIVE EMBODIMENT

According to the method of the present invention, the starting point of the method is a placed design mixing static and domino cells, which meets its timing requirements. As known in the prior art, the placed design is produced according to the steps shown in the flow diagram of FIG. 1. Firstly, the design is synthesized from its Register Transfer description (RTL) and mapped to a simplified version of the domino library, where the clock pins and consequently the timing arcs that relate to them have been removed, augmented with static inverters. Then the design is unated, meaning that the inversions are pushed towards the ends of the datapaths, leaving only non-inverting combinational domino cells inside the datapath. The following step includes a timing-driven placement, which iterates on optimizing the timing and the area of the design. During this step, the tool is also allowed to use non-inverting cells from the static library. Since static cells are on average smaller than domino cells, they are used in replacement of the large domino cells wherever there is some timing slack, therefore trading timing for area and improving the overall optimization cost function. Experience shows that on average between 40% and 60% of the domino cells are replaced with static cells. Up to this stage, domino cells have been treated exactly as static cells, only faster and larger. The precharge paths have not been considered and only the evaluate paths have been optimized.

The next stage comprises considering the clocking system made of "N" overlapping phases (phase assignment). For the purpose of describing an embodiment of the present invention, N is made equal to 4. However, it will be appreciated by those skilled in the art that the present invention applies to any number of phases.

Figure 2A:
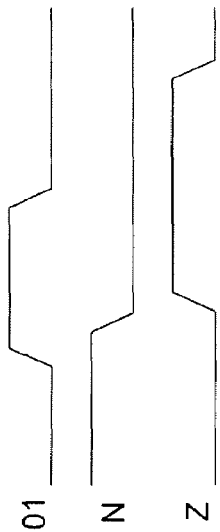
FIG. 2(a) is a schematic diagram of an input of a domino gate originating in a static block.
Figure 2B:
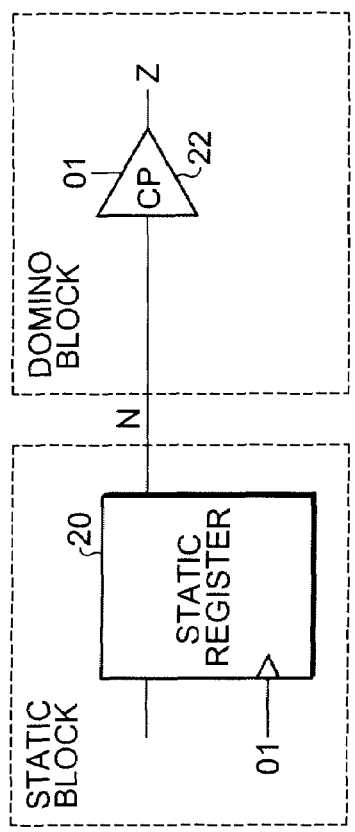
FIG. 2(b) is a timing diagram showing the undesirable capture of a previous logic one state at the output of a domino buffer due to insufficient time transpiring before the clock pin CP of a domino gate turns high.
Figure 2C:
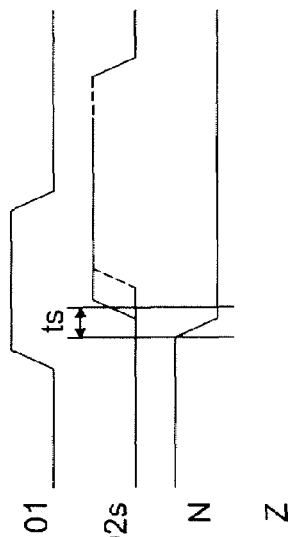
FIG. 2(c) is a timing diagram showing a first solution for addressing the problem produced by clocking the buffer with a later clock phase.
Figure 2D:
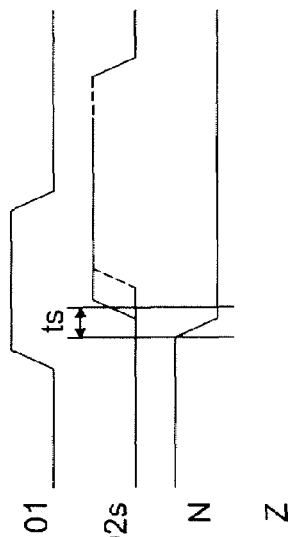
FIG. 2(d) is a timing diagram showing a more effective way for addressing the problem produced by clocking a buffer with a delayed version of $\Phi 1$ to ensure that the input N is stable long enough before the clock rises.
Figure 2E:
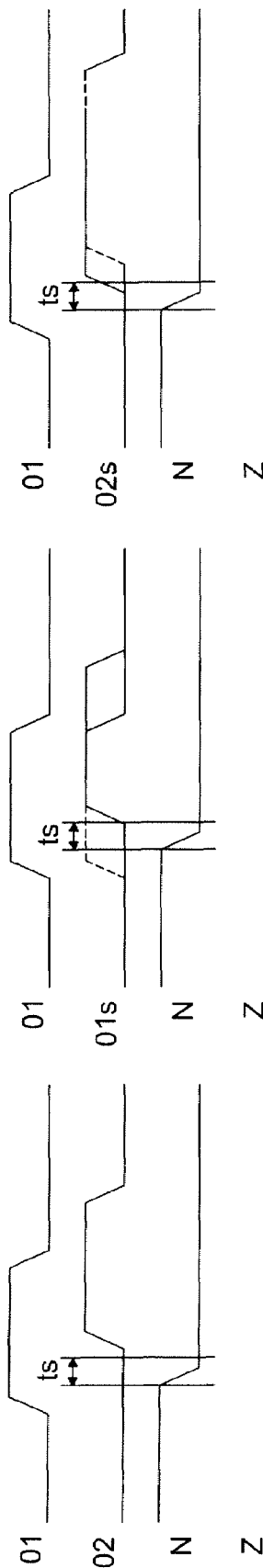
FIG. 2(e) is a timing diagram showing an alternative to the previous solution produced by clocking the buffer with an anticipated version of $\Phi 2$ to ensure that the input N is stable long enough before the clock rises.

The method of the present invention further comprises defining and enforcing a number of rules during the phase assignment stage to ensure that the design is functional, but also that the design works at maximum efficiency. These rules are the following:

Rule #1: A domino gate cannot capture a falling transition. In a pure domino design, this rule is not a problem, since a falling transition indicates a precharge and not an actual logic state. However, if the input of a domino gate comes from a static block, as is shown in FIG. 2(a), then a falling transition indicates a change in state (from a logic one to a logic zero). For this change to be captured by the domino gate 22, it is mandatory that some time transpire (setup) before the clock pin CP of the domino gate 22 turns high, otherwise the previous value (namely a logic one) is captured instead, as is shown in FIG. 2(b). The timing problem described above at the interface between a static cell and a domino cell requires delaying the data path in order to prevent a "shoot through" of the data. In a fixed clock scheme (targeting zero skew), the penalty can be up to a quarter of a cycle. In FIGS. 2(c), 2(d), and 2(e) the following four signals are shown: the phase clocking the static register; the phase clocking the domino gate; the static signal issued by the register and consumed by the domino gate; and the output of the domino gate. In FIG. 2(c) the phase of the domino gate has been shifted to the earliest clock phase rising after the timing requirement "ts", which represents a precharge setup plus some provision for the clock uncertainty (PLL jitter, clock tree skew, on-chip variation, and the like). The transition on the output is now triggered by the rising edge of the clock on the domino gate (instead of a transition on the input data pin). The delay incurred by this static-to-domino interface is at least (tCPZ+ts+tDZ) ) where tCPZ is the propagation delay from the clock pin to the output pin, and tDZ is the propagation delay from the data pin to the output pin of the domino gate. FIG. 2(c) also shows that, without any particular skew constraint on the clock signal, some time is wasted waiting for the clock to arrive. This wasted time can be as much as ¼ of a period. In order to keep the interface delay to its minimum, it is important to adjust the clock arrival with respect to the timing requirement "ts". This is done either by skewing forward the clock phase preceding the data arrival as shown in FIG. 2(d), or by skewing backward the clock phase following the data arrival as shown in FIG. 2(e). The approach shown in FIG. 2(e) offers the advantage over the previous approach in that the clocks triggering the source of the static signal and its target are now different. Therefore, if N arrives later than expected, and since the delay between Φ2 and Φ1 is a function of the clock period, by slowing down the design, the phase delay is increased and the proper functionality is maintained.

Figure 3:
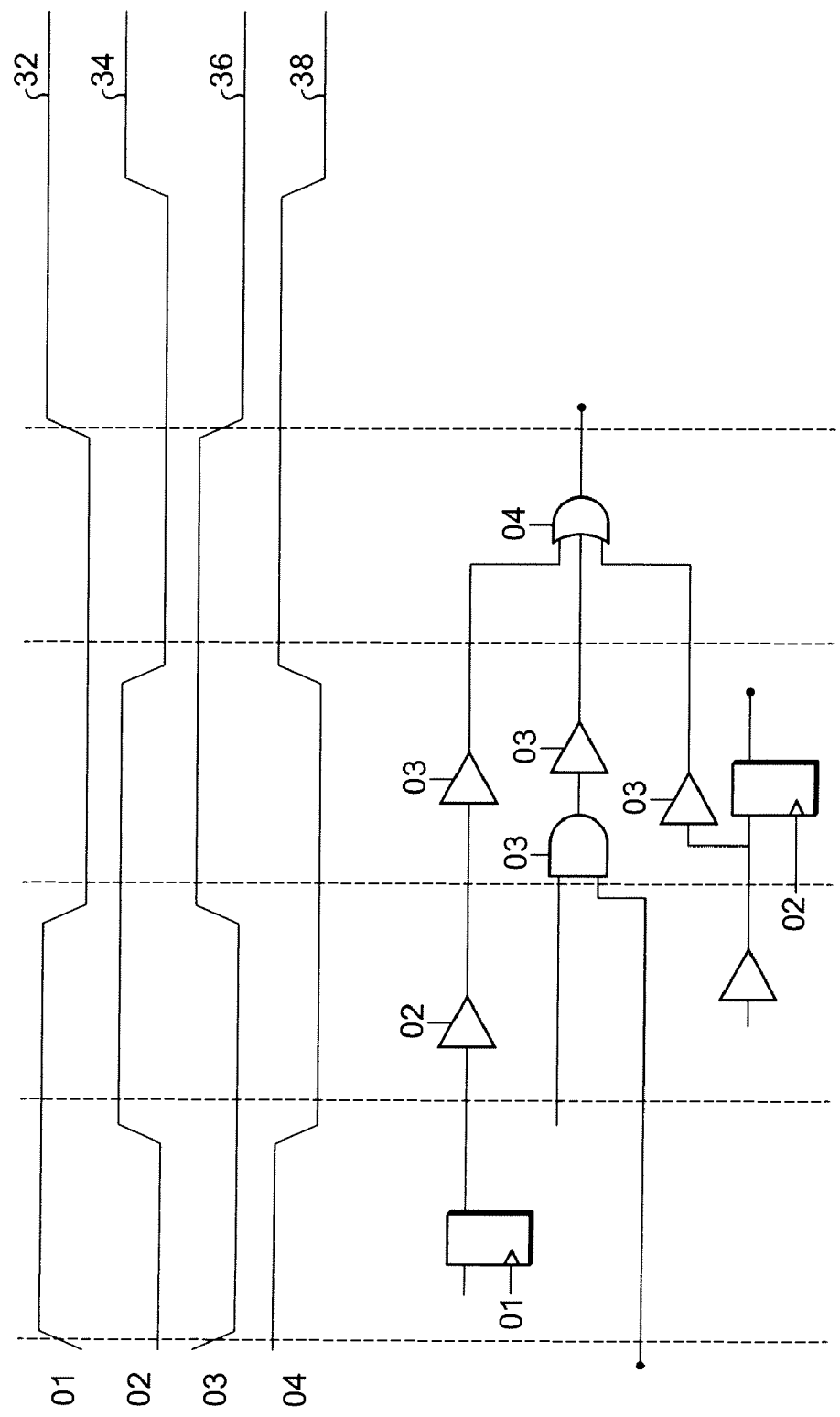
FIG. 3 is a combined timing and logic gate diagram showing an initial phase assignment that ensures that the clock is present (high) before the domino input data sets.

Rule #2: In order to avoid wasting time on a critical path, it is important to ensure that the clock is present (high) before the input data sets. Therefore, the initial phase assignment is done based on the data arrival on each domino gate input as is shown in FIG. 3. Each domino gate is initially assigned to the clock that starts immediately before the last data arrives (assuming some clock skew). Note in FIG. 3 that traces 32, 34, 36, and 38 represent the four overlapping clock phases and the domino gates are drawn with respect to these phases according to their latest data arrival time.

Figure 4A:
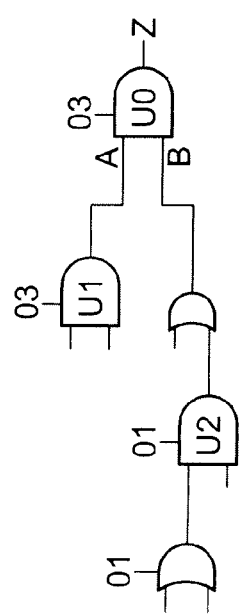
FIG. 4(a) is a combined timing and logic gate diagram showing a phase skipping timing problem in which data is lost.
Figure 4A:
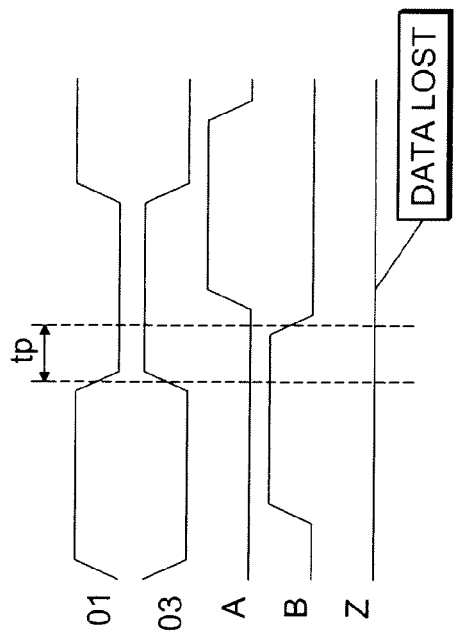
Figure 4B:
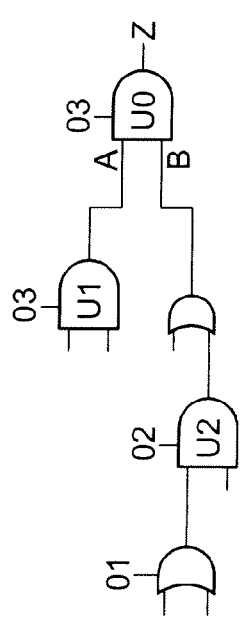
FIG. 4(b) is a combined timing and logic gate diagram in which the phase skipping problem is addressed by assigning a domino driver to a later phase.
Figure 4B:
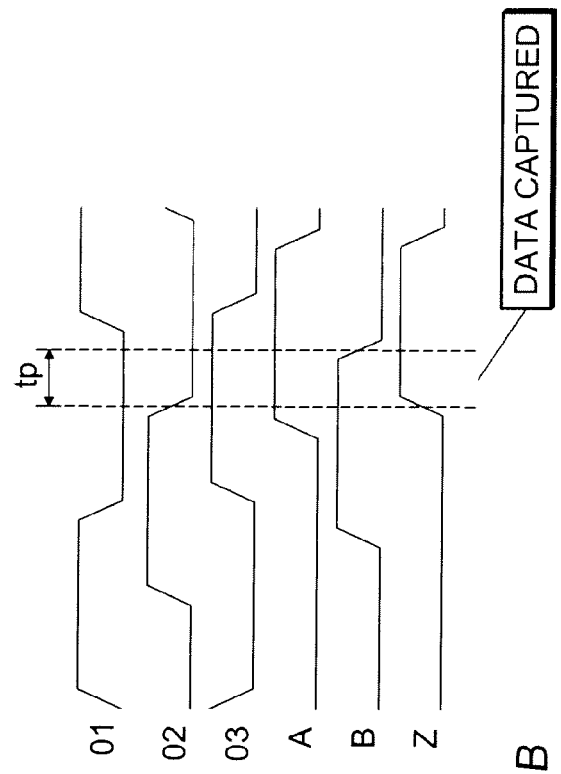

Rule #3: Domino logic is a pulsed logic. A logic one on a domino gate output is only valid during a period of time before the output data state goes back to precharge and is lost. Therefore, it is key to ensure that the gate downstream always consumes the data before it is lost. This constraint leads to the following rule: the first layer of domino gates in the fanout cone of a domino cell clocked by phase N has to be clocked by phase N or N+1. If this rule is violated a phase skipping situation occurs as is shown in FIG. 4(a) where the domino gate U2, clocked by $\Phi1$, drives, through a static gate, the domino gate U0 clocked by $\Phi3$. Note that the data on output node Z is lost. The phase skipping problem can be fixed in three different ways:

As is shown in FIG. 4(b), the phase skipping problem can be addressed by assigning the domino driver to a later phase. This assumes that the driver output has enough timing slack to be delayed and possibly wait for the clock. Note in FIG. 4(b) that domino gate U2 is driven by clock phase $\Phi2$ and not $\Phi1$ as in FIG. 4(a). Also note in FIG. 4(b) that the data on output node Z is captured and not lost as in FIG. 4(a).

Figure 4C:
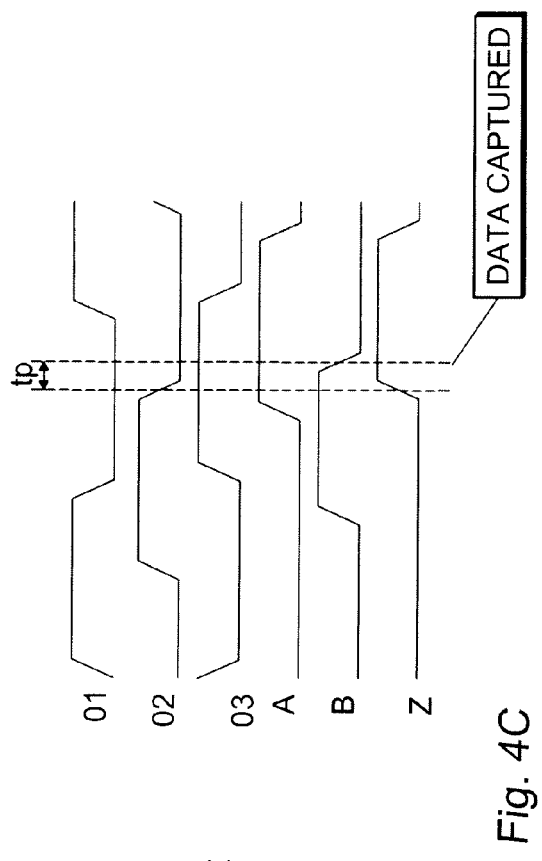
FIG. 4(c) is a combined timing and logic gate diagram in which the phase skipping problem is addressed by reverting a static gate to a domino gate and assigning the domino gate to the appropriate phase.
Figure 4C:
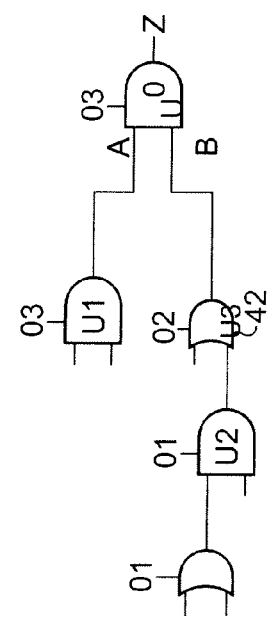

As is shown in FIG. 4(c), the phase skipping problem can be addressed by reverting a static gate to a domino gate and assigning the domino gate to phase N+1. This solution is more costly than the previous one, since a domino gate is likely to be larger than a static gate. Furthermore, it is also possible that the input data will have to wait for the clock and therefore the output will be delayed. However, this should not be an issue since in any event the output data has to wait for the next phase before being consumed, which means that the gate has at least a quarter of a period to evaluate. In conclusion, this solution can be considered if the previous is not applicable (not enough timing slack). Note in FIG. 4(b) that gate 42 has been reverted to a domino gate driven with clock phase $\Phi2$. Also note in FIG. 4(c) that the data on output node Z is captured and not lost as in FIG. 4(a).

Figure 4D:
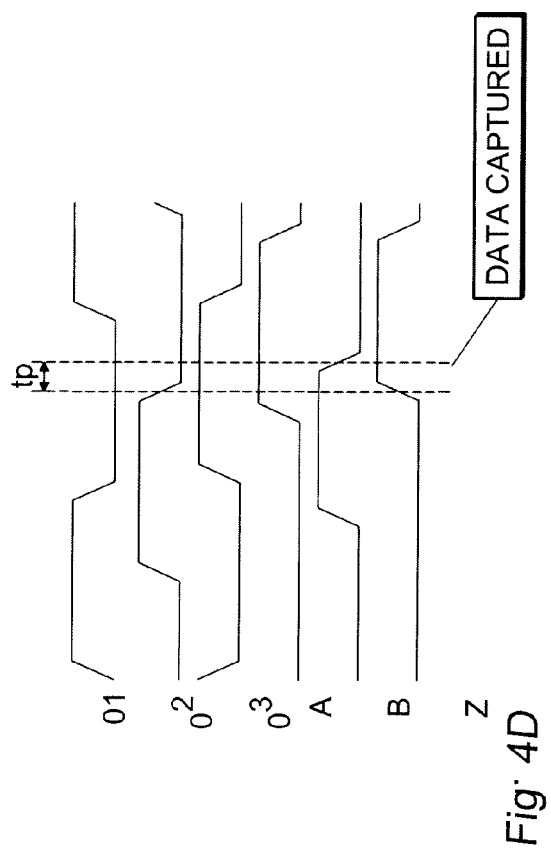
FIG. 4(d) is a combined timing and logic gate diagram in which the phase skipping problem is addressed by inserting a domino buffer clocked by the appropriate phase on a slow input.
Figure 4D:
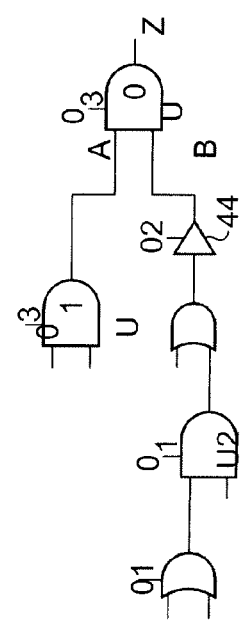

As is shown in FIG. 4(d), the phase skipping problem can be addressed by inserting a domino buffer on phase N+1 on the slow input. This solution is the most costly since it implies the insertion of a new cell. It is therefore only considered when none of the previous solutions is applicable. Note in FIG. 4(d) that a domino buffer 44 driven by clock phase $\Phi2$ is inserted. Also note in FIG. 4(d) that the data on output node Z is captured and not lost as in FIG. 4(a).

Derogation for this rule can be tolerated in the case of a single phase skipping (domino gate U2 on phase N driving through some static cells a domino gate U0 on phase N+2), if the precharge delay from U2 to U0 is large enough. Note in FIG. 4(a) that if the precharge time "tp" is stretched long enough, the input B of domino gate U0 ends up falling long enough after the input A has risen and consequently the output Z is correctly evaluated and not lost. This result could be achieved by slowing down (using a smaller drive) the static cell.

Figure 5A:
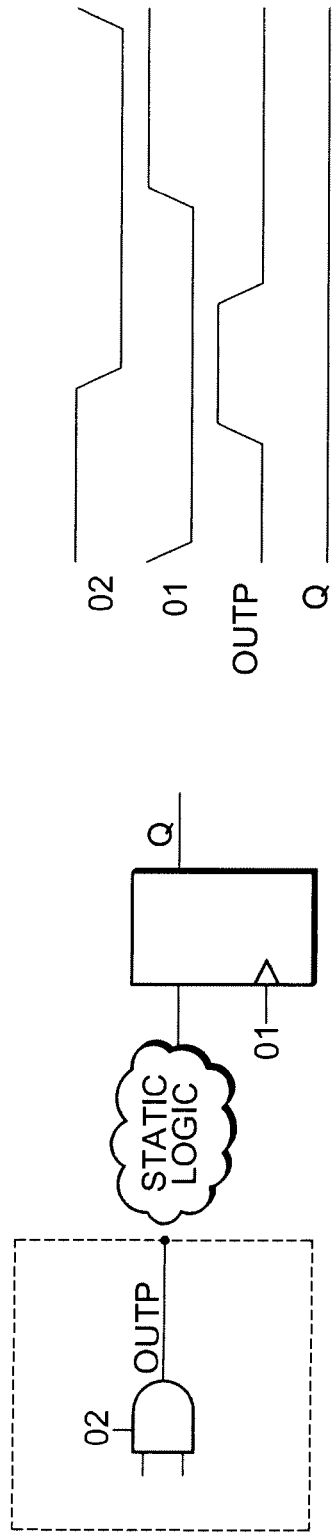
FIG. 5(a) is a combined timing and logic gate diagram in which a primary output is to be captured by a static block, and the primary output was not captured before going to precharge, resulting in invalid captured data.
Figure 5B:
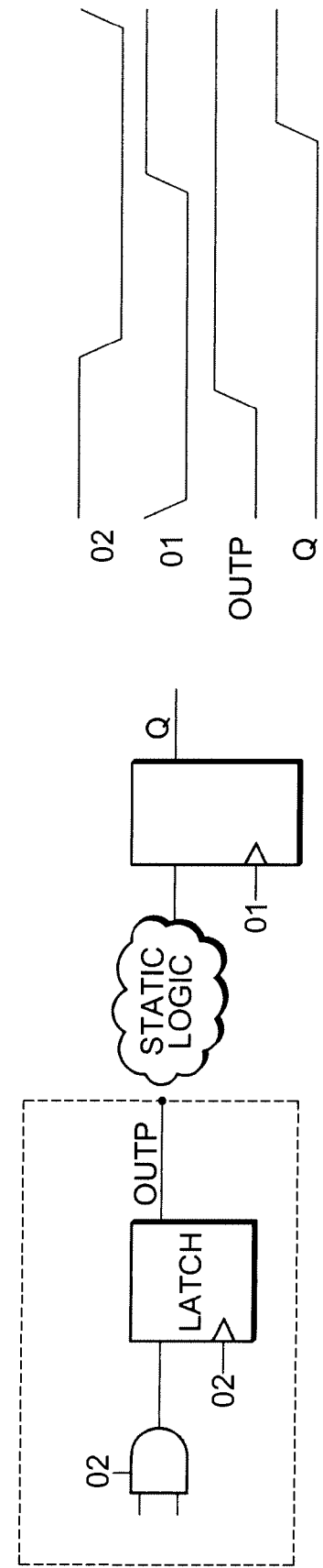
FIG. 5(b) is a combined timing and logic gate diagram as in FIG. 5(a), in which a latch has to be inserted and clocked by the appropriate clock phase to keep the data valid.
Figure 5C:
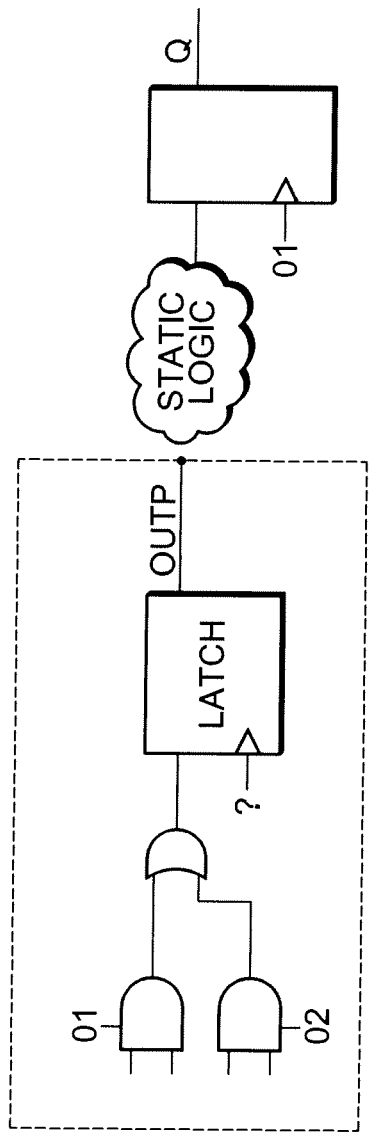
FIG. 5(c) is a combined timing and logic gate diagram as in FIG. 5(a) in which several domino gates contribute to the output through static logic, in which the phases of the domino gates are not aligned, such that the precharge can not be filtered.
Figure 5D:
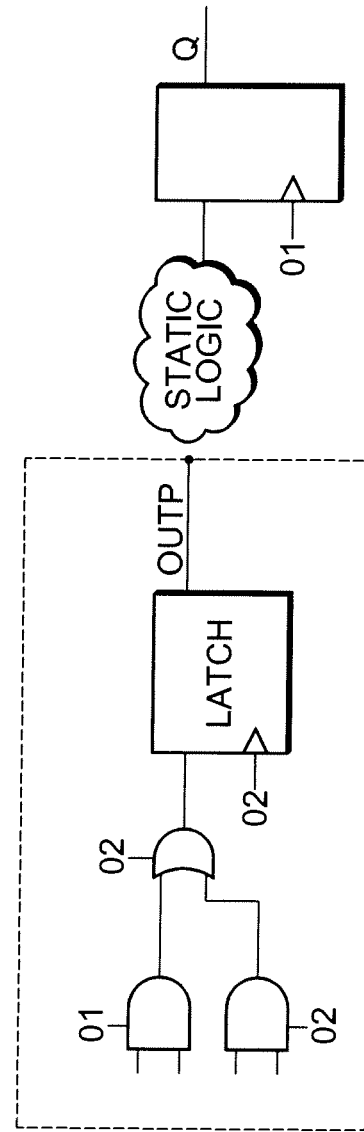
FIG. 5(d) is a combined timing and logic gate diagram as in FIG. 5(c) in which the phase conflict has been solved by reverting the static gate to domino.

Rule #4: If a primary output carrying a domino signal is to be captured by a static block, it is essential that the pre-charge is filtered out. Referring now to FIG. 5(a), the value on node OUTP is erased before capture, and therefore the data on output node Q is not valid. If the precharge is triggered by the last phase, no changes are required, since the precharge happens in the next cycle. Otherwise, a latch has to be inserted to keep the data valid. This is shown in FIG. 5(b). Note that a LATCH has been inserted between the domino gate and the static logic block. The inserted latch is clocked by the same clock, in this case $\Phi2$, which precharges the output. Now, if several domino gates contribute to the output through static logic, as is shown in FIG. 5(c), it is mandatory that their phases are aligned, otherwise the precharge can not be filtered. If it is not the case, this must be addressed by reverting the static cell driving the output to a domino cell and by clocking the domino cell with the latest phase as is shown in FIG. 5(d). Subsequently, Rule #3 should be checked.

Figure 6A:
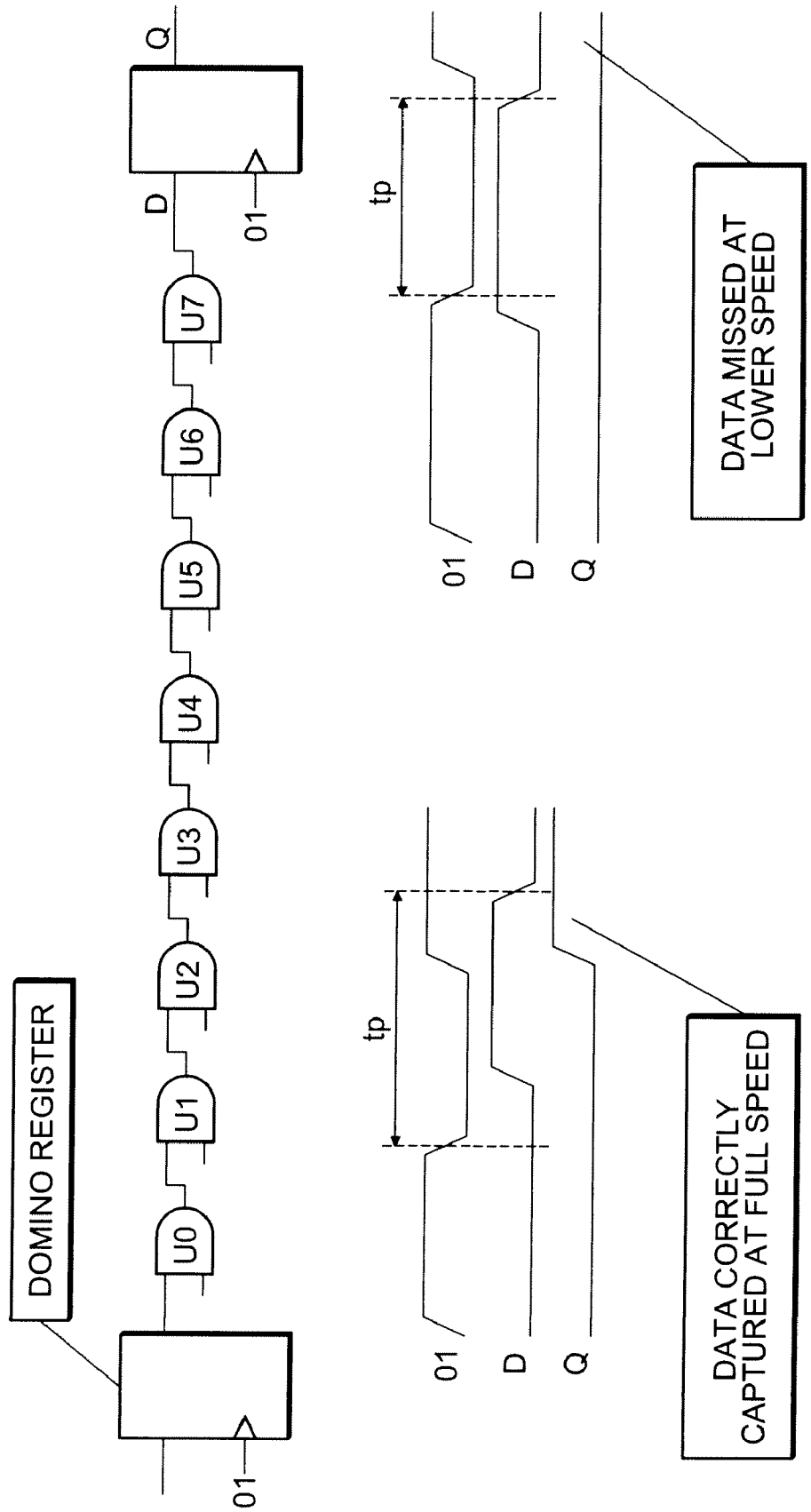
FIG. 6(a) is a combined timing and logic gate diagram showing a domino register and static gates in which a first timing case shows data being correctly captured at full operating speed, and a second timing case shows data being missed at an operating speed less than the full operating speed.

Rule #5: the domino design must work at any speed below the maximum speed. Therefore the delay through static logic cannot be relied upon to filter out the precharge. FIG. 6(a) shows two cases. In the first case, data is correctly captured at full operating speed, because the precharge (falling transition on the D input) has been pushed away by the static path and is happening in the next cycle. In the second case, data is missed at a lower operating speed because now the precharge arrives before the valid data on D is captured by the register.

Figure 6B:
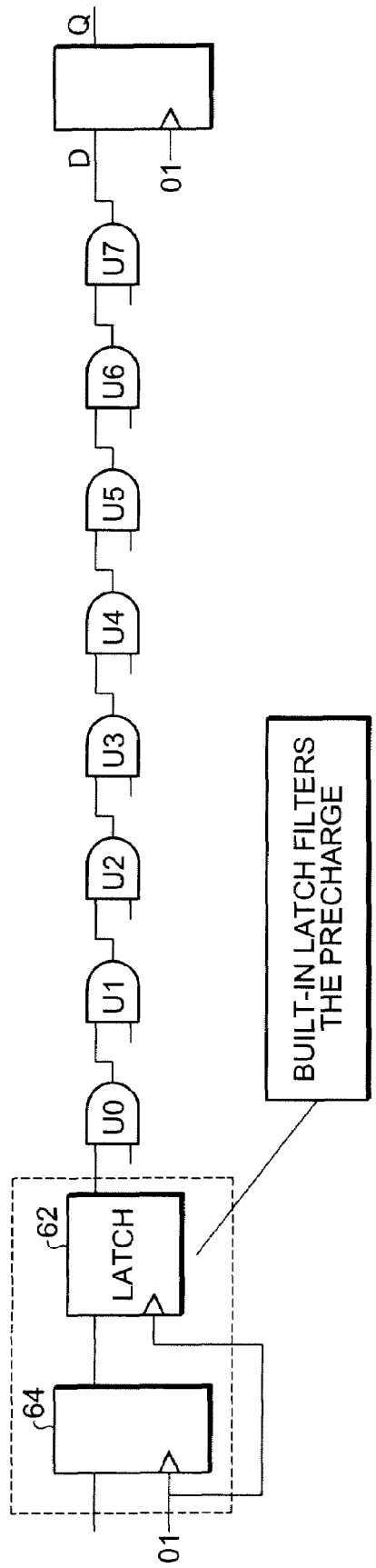
FIG. 6(b) is a logic gate diagram as in FIG. 6(a) in which a latch is inserted to convert the domino signal into a static signal, thus filtering out the precharge.
Figure 6C:
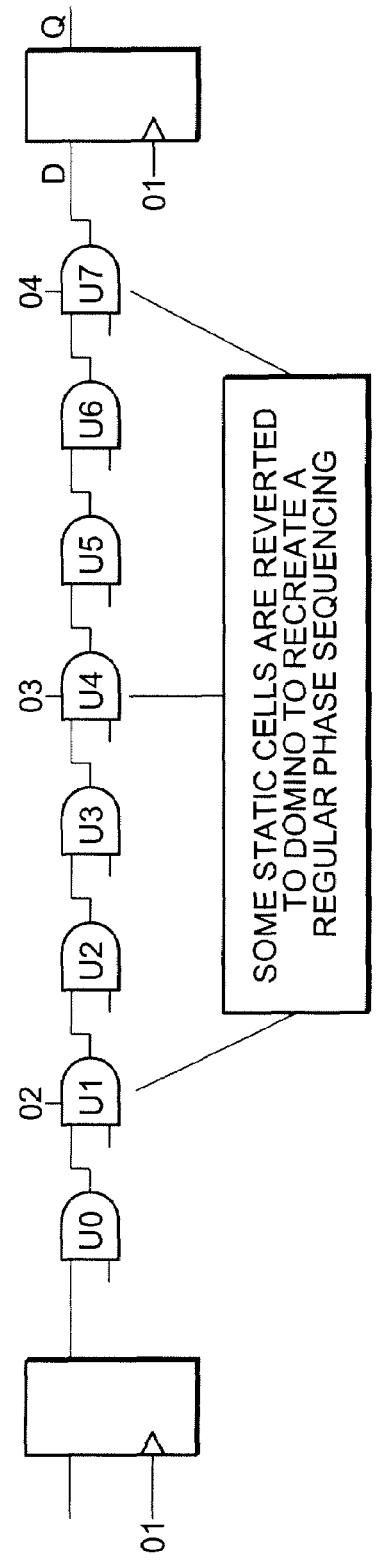
FIG. 6(c) is a logic gate diagram as in FIG. 6(a) in which some of the static cells are reverted to domino cells with the proper phase sequencing.

There are two ways to address the problem of operation below the maximum speed. One is to revert some of the static cells to domino cells and ensure the phase sequencing (similar approach to the one described for rule #3) as is shown in FIG. 6(c). Note that domino gate U1 is driven by clock phase $\Phi2$, domino gate U4 is driven by clock phase $\Phi3$, and domino gate U7 is driven by clock phase $\Phi4$. While this solution can only speed up the design, the drawback is that area and power consumption increase (because there are more clocked domino cells). The other solution is to insert a latch to convert the domino signal into a static signal (filtering out the precharge). Note the presence of latch 62 in FIG. 6(b). In order to apply this solution the static cone must have enough timing slack to accommodate the delay through the latch, which is usually the case. In the case when the static cone of logic goes from register to register, the latch 62 can be built into the starting register 64 allowing a minimum timing, area, power overhead as is shown in FIG. 6(b).

Although these rules help creating a robust domino logic implementation, they are not sufficient and a number of additional checks are ideally performed.

Constraint #1: An additional check regarding the evaluation setup is ideally performed. The input data of a domino cell has to rise some setup time before the clock falls (cell going to precharge). This constraint will probably be satisfied due to the phase assignment discussed above with respect to Rule #2. Indeed, this rule implies that only the first part of the clock pulse is used to capture the data (as shown in FIG. 3). Actually, the minimum delay between the data arrival and the falling edge of the capturing clock is given by the phase overlap minus some skew, which is usually much larger than the setup requirement.

Constraint #2: An additional check regarding the precharge setup is ideally performed. The input data has to fall (go to precharge) some setup time before the clock rises to avoid shoot through (capturing the previous value). Problems usually occur when a static signal goes into a domino gate (see Rule #1) or if the design runs at very high speed (~1 GHz) and the precharge is delayed through static gates. In this second case, to fix the problem, the precharge path has to be sped up or shortened. One solution is to size-up the cells on the precharge path (starting with the static cells). Note in FIG. 7(a) that the slow static cell U1 can be sized-up to a faster drive. Another solution, if the precharge path goes through static cells that are already maxed-up, consists in reverting a static cell to a domino cell in order to break a long precharge path into two short precharge paths. Note in FIG. 7(b) that the static gate U1 has been reverted to a domino gate clocked by $\Phi 1$, and the precharge path from U0 to U2 has been broken into two precharge paths from U0 to U1 and from U1 to U2. If none of the previous solutions can be applied, the last solution includes adjusting the duty cycle of the precharge phase to shorten it. However, care must be taken since this can create an evaluation setup violation. This constraint is the one that mostly limits the maximum speed of a domino implementation using the method of the present invention.

Constraint #3: An additional check of the evaluation hold is ideally performed. The input data should stay valid some time after the clock has turned high. This constraint enables the verification of Rule #3, as discussed above.

Figure 8A:
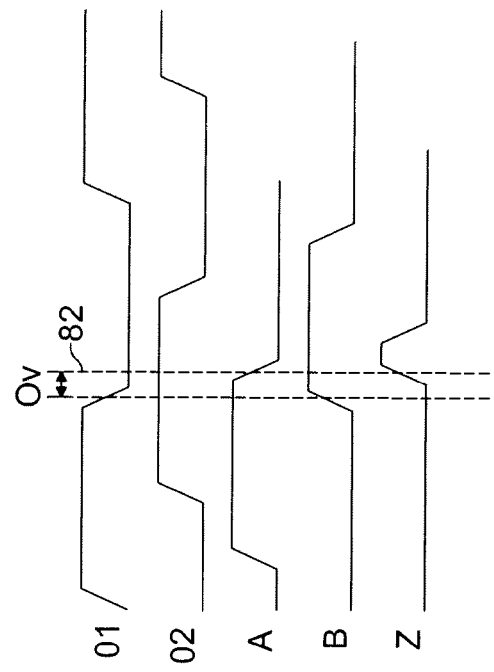
FIG. 8(a) is a combined timing and logic gate diagram illustrating a minimum data overlap check between two ANDed domino inputs.
Figure 8A:
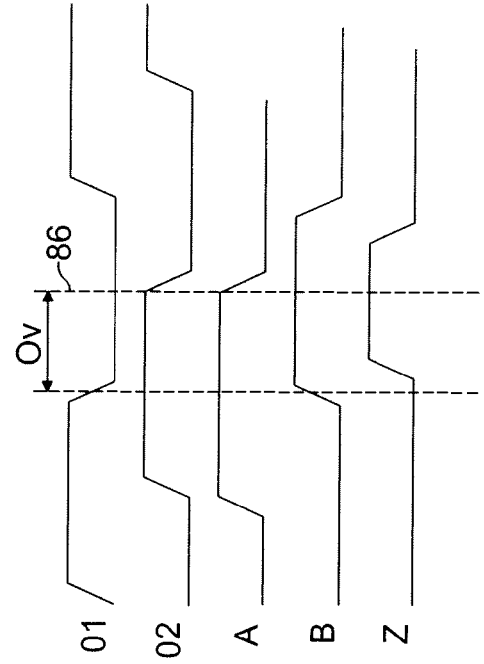
Figure 8A:
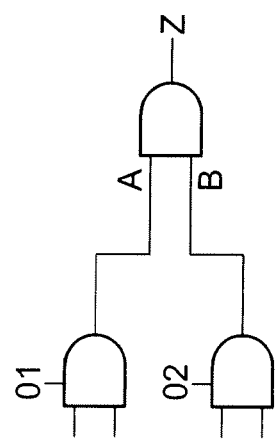
Figure 8B:
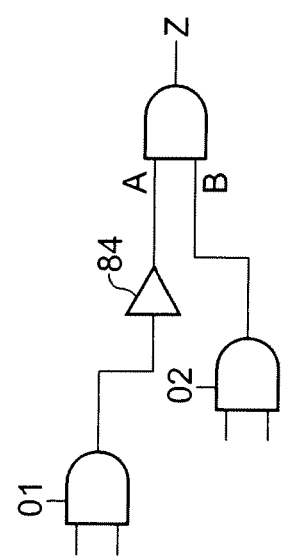
FIG. 8(b) is a combined timing and logic gate diagram as in FIG. 8(a) in which a static buffer is inserted to increase the amount of overlap between the two aforementioned ANDed domino inputs.

Constraint #4: An additional check of minimum data overlap is ideally performed. Once again, since domino logic is a pulsed logic, in order for a logical function (whether it is static or domino) to be computed properly, the operands pulses should ideally overlap a certain amount of time as is shown in FIG. 8(a) Note the overlap 82 of waveforms A and B shown in FIG. 8(a). A special characterization of the standard cells (static and domino) is required to determine the minimum data overlap that produces a pulse on the output that is wide enough (enough energy) to properly be captured by the next gates. A violation may occur when a cell receives data precharged by different phases. To fix the problem, the data coming from the early phase has to be delayed, typically using a static buffer as is shown in FIG. 8(b). Note the presence of static buffer 84 shown in FIG. 8(b). Notice also the expanded overlap 86 shown in FIG. 8(b).

The rules defined above are enforced through an automated procedure, known as "phase assignment" and they are eventually verified using the constraints defined above, which are characterized for each domino cell (setups, hold, data overlap) and each static cell (data overlap). The constraints are checked with a Static Timing Analyzer (Synopsys Primetime®) plus an ad-hoc script for the data overlap check.

Figure 9A:
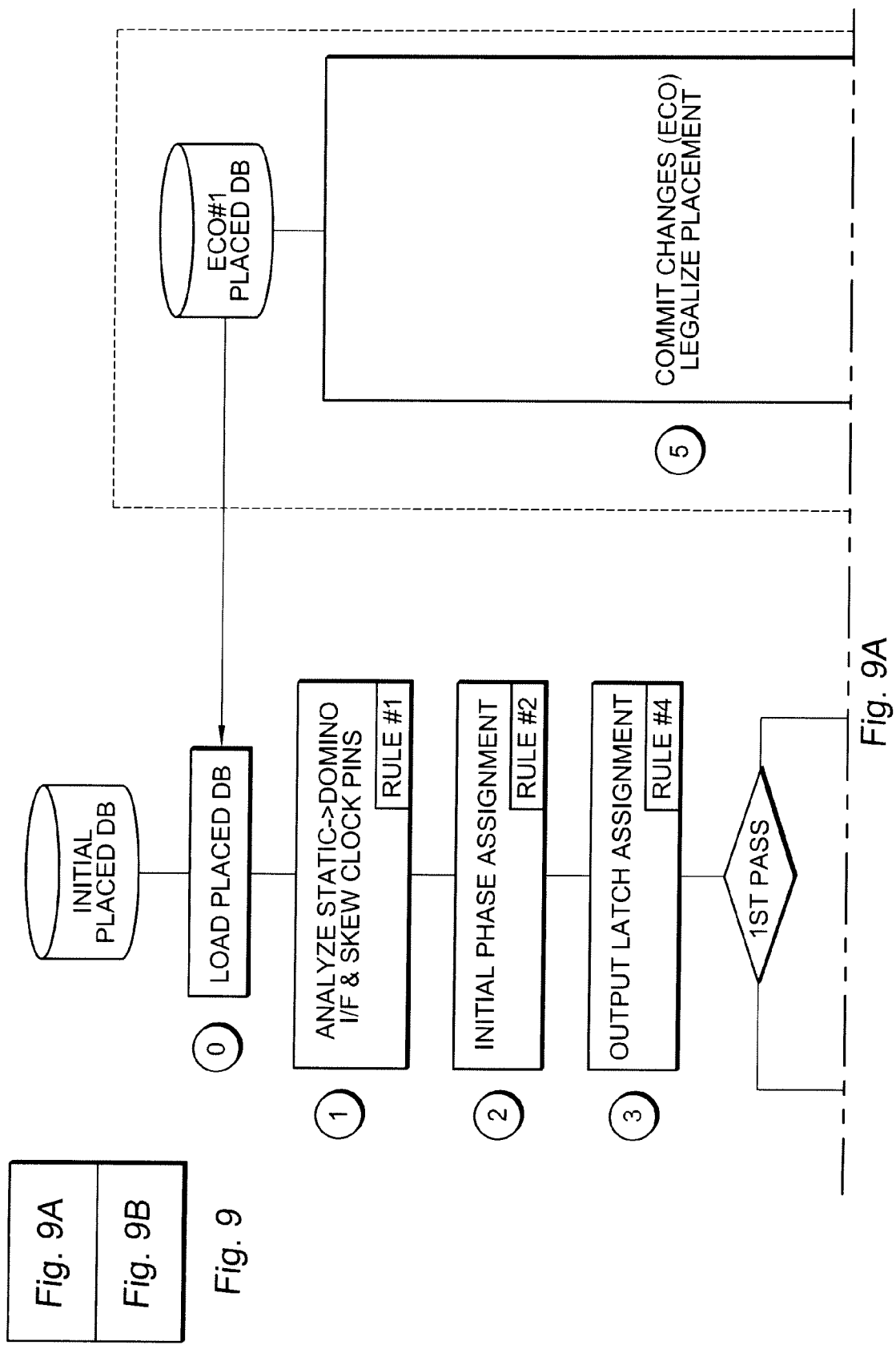
FIG. 9 is a flow chart showing an overview of the phase assignment script.
Figure 9B:
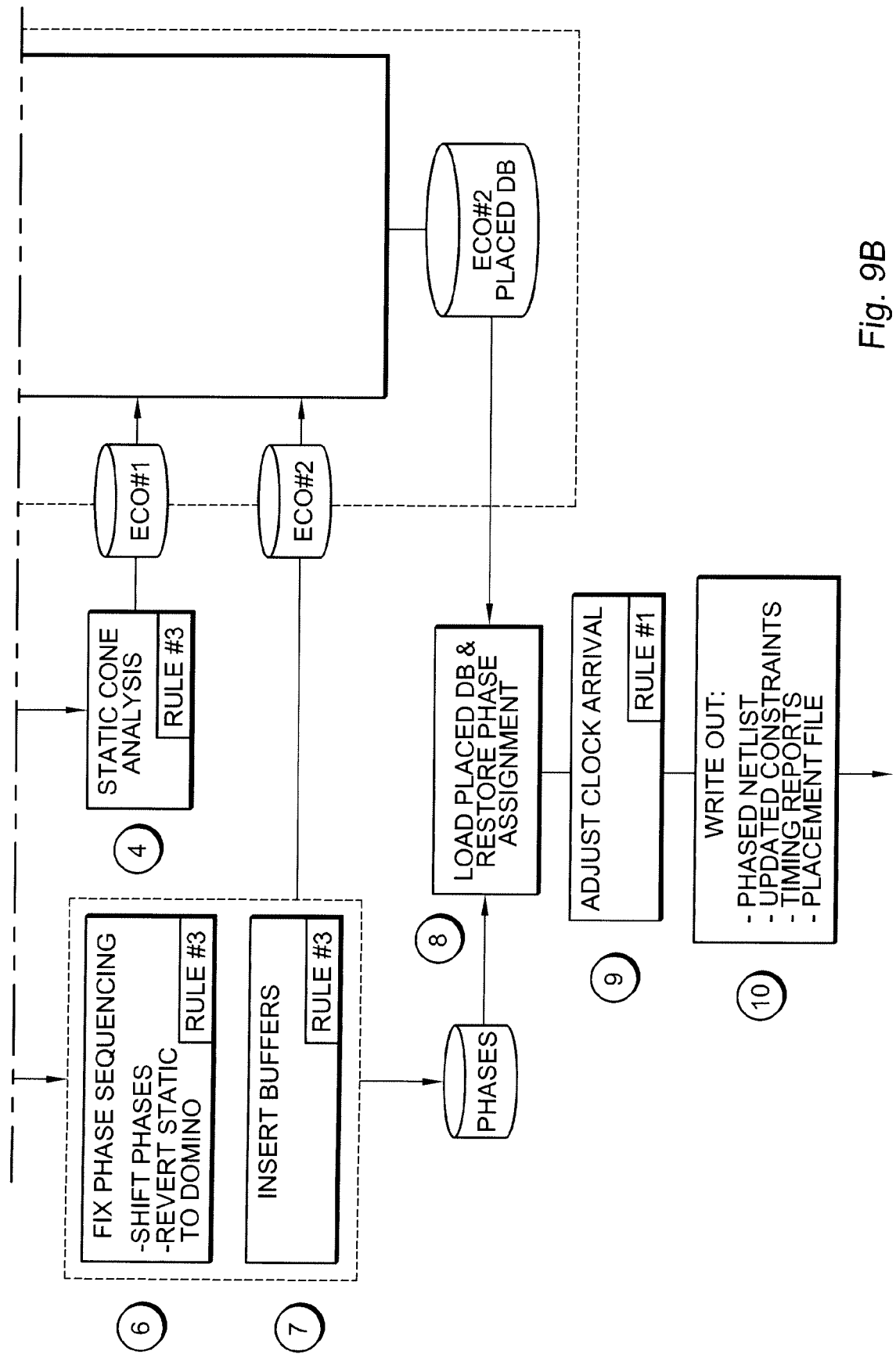

FIG. 9 gives an overview of the phase assignment script. The phase assignment is a process that iterates between a Static Timing Analyzer environment (namely Primetime from Synopsys®) and a Standard Cell Placer (namely Physical Compiler® from Synopsys) The first environment is used to analyze the design, to define the changes to be applied and finally to hook-up the clock pins, which includes all the steps but #5. The second environment is used to commit the changes defined above and to update the placement (step #5). The first environment uses the full domino timing model (14 in FIG. 1) and therefore considers the evaluate paths as well as the precharge paths. The second environment uses a simplified version of the domino library (12 in FIG. 1) and therefore considers only the evaluate paths. In this environment domino cells and static cells are logically equivalent.

The following describes the Steps from #0 to #10 as is shown in the flow chart of FIG. 9.

Step #0 reads the initial placement database (produced by the placement step of FIG. 1), maps it to the complete domino library (14 in FIG. 1) and re-analyzes the evaluate timing paths. At this point it is mandatory that the input-to-register, register-to-register and register-to-output paths meet timing.

Step #1 looks at the domino data inputs receiving a static signal and according to Rule #1 places a delay on their clock pins to accommodate the Constraint #2 (as shown in FIG. 2(d)).

Step #2 performs a first initial assignment based on Rule #2 (as shown in FIG. 3).

Step #3 assigns a clock to the output latches based on Rule #4 (as shown in FIG. 5(b)).

Step #4 looks for registers having pure static logic cones. Each candidate is marked to be replaced by an equivalent register with a built-in latch and the static logic cone is marked to be transferred to the output of the latch (as shown in FIG. 6(b)). The marking is written to an ECO#1 file which is processed by the Standard Cell Placer in Step #5 in order to find a legal location to all the cells that have been modified or inserted.

The output of Step #5 is a new placed database, which is processed anew from Step #0 to Step #3.

Step #6 performs a reverse traversal of each cone of logic starting from the end points (register data inputs or primary outputs) and going towards the start points (register outputs or primary inputs). At each stage, the script looks at what phase captures that data and what phase launches the data, and enforces the rule #3. If a phase skipping situation is encountered, the appropriate action will be taken: phase re-assignment (as shown in FIG. 4(b)) or cell swapping (as shown in FIG. 4(c)). If none of the previous actions can be taken (not enough timing slack or no static cell to revert), then the net is marked for further action in step #7.

Step #7 revisits all the phase skipping situations that have not been fixed in step #6. At this point, the user can allow single phase skipping through at least one static gate. The remaining violations are fixed by inserting one or more domino buffers to maintain the proper phase sequencing.

All the phase assignments defined up to this point are stored in a "phases" file, which contains for each domino cell clock pin, and output latch clock pin, the clock phase that has been assigned.

All the changes scheduled in Step #6 and #7 are actually written to an ECO#2 file, which is processed by the Standard Cell Placer in Step #5. The output of Step #5 is a third placed database, which is read in Step #8 together with the "phases" file in order to restore the phase assignment previously defined.

Step #9 looks at all the domino input data receiving a static signal and verifies if the Constraint #2 is met. If it is not met, a delay constraint is applied to the clock pin of the domino cell (as shown in FIG. 2(d)). In the case when the phase to be delayed is the first one (namely $\Phi 1$) and the delay is less than the budgeted clock tree insertion delay, then the positive delay on $\Phi 1$ is converted into a negative delay on $\Phi 2$ (as shown in FIG. 2(e)).

Figure 1:
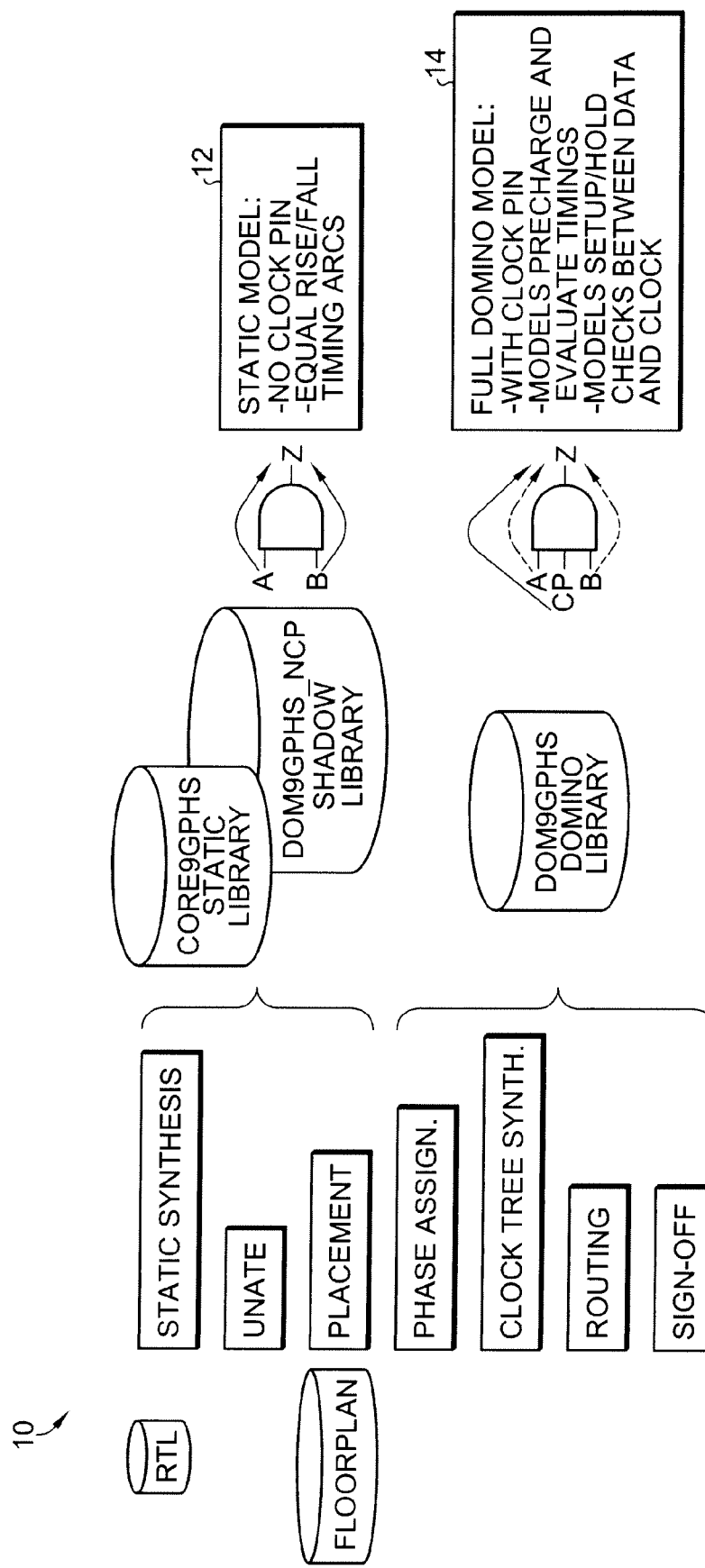
FIG. 1 is a block diagram of a synthesis flow used in the prior art, as well as a description of two timing models used for the domino gates including a simplified one (pseudo-static) used before the phase assignment and the full one used after.

Finally, Step #10 writes out the final outputs of the phase assignment, which are then carried over to the following steps of the implementation flow, namely Clock Tree Synthesis (FIG. 1). These outputs are the phased design netlist, the updated placement information, the final timing constraints and the final timing reports. This step also outputs additional clock constraints, defined in Step #9, which are given to the physical implementation flow to instruct the Clock Tree Synthesis tool (see FIG. 1) as to which clock pins need to be delayed.

The objective of the phase assignment script described above is to enforce the rules that guaranty the proper functionality of the domino design, but also to keep as many static cells as possible and to insert as few domino buffers as possible in order to minimize the increase in area and power, as well as to limit the design and consequently the timing perturbation during the placement legalization. The design database resulting from the phase assignment will have to be checked against the timing constraints defined previously. It is extremely likely that timing violation will be found. But these violations should be easy to fix by any timing-driven implementation tool that understands the domino timing model, like Synopsys Astro®, which is able to size up and down logic cells in order to speed up or down the timing paths and hence to meet setup and hold constraints. Besides, a script developed around Synopsys Primetime® allows a check of constraint #4 (minimum overlap requirement) and produces a list of pins to be delayed together with the appropriate buffer to be inserted, which is then processed by Astro.

The following technique illustrates how to minimize the number of inserted buffers.

Figure 10A:
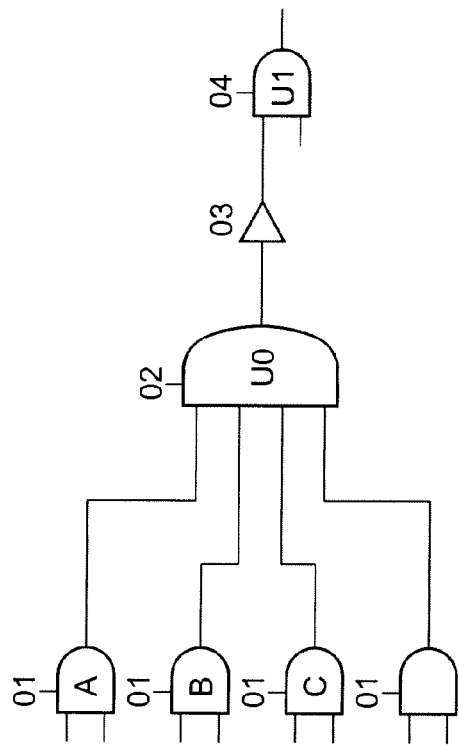
FIGS. 10(a), 10(b), 10(c) and 10(d) are schematic diagrams in which a phase skipping situation is handled in two different ways by inserting domino buffers, one as shown in FIG. 10(b) being more cost effective than the other as shown in FIG. 10(d)
Figure 10B:
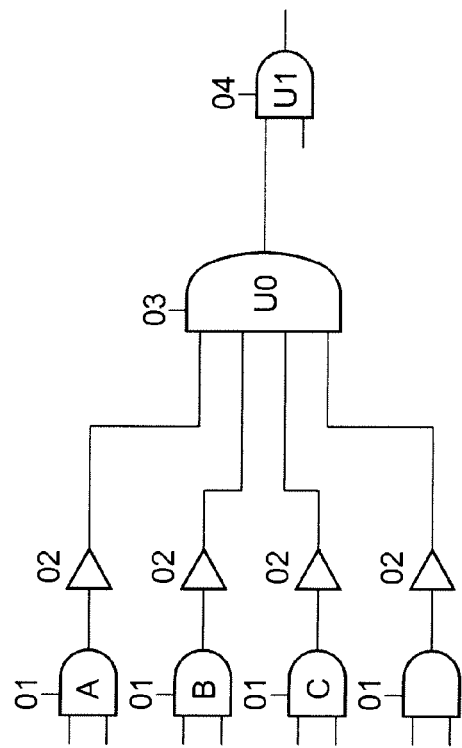
Figure 10C:
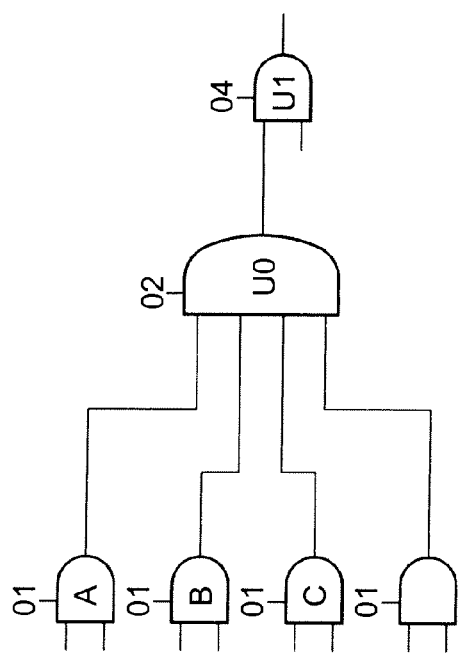
Figure 10D:
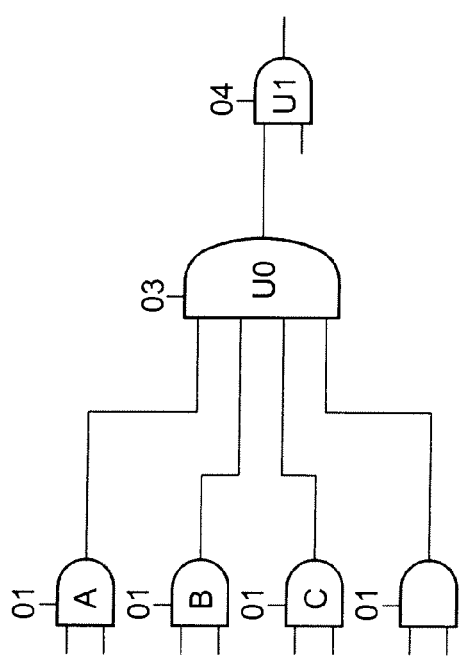

During Step #6, when the script encounters a phase skipping situation that could be fixed by re-assigning a domino gate to a later phase (as shown in FIG. 4(b)), some further analysis has to be performed before to commit the change. As shown in FIG. 10(a), let us assume that the script has traversed a domino datapath, has reached the domino gate U0 and has found a phase skipping situation (in this example, a cell clocked by Φ2 driving directly a cell clocked by Φ4). Let us also assume that the output of U0 has enough timing slack, such that U0 can be reassigned to Φ3 (as shown in FIG. 10(c)) without creating a timing violation. This fix may appear as extremely cost effective. However, while pursuing the traversal of the datapath, by shifting the phase of U0 a number of new phase skipping situations have been created that may require a number of domino buffers to be inserted, as shown in FIG. 10(d). Therefore, before re-assigning a domino gate to a later phase, the script looks at its fanin and computes the number of potential violations that could be introduced if the cell was on a later phase. If the number is greater than one, the re-assignment is not done and the insertion of a domino buffer on the output is used instead, as shown in FIG. 10(b).

Figure 11B:
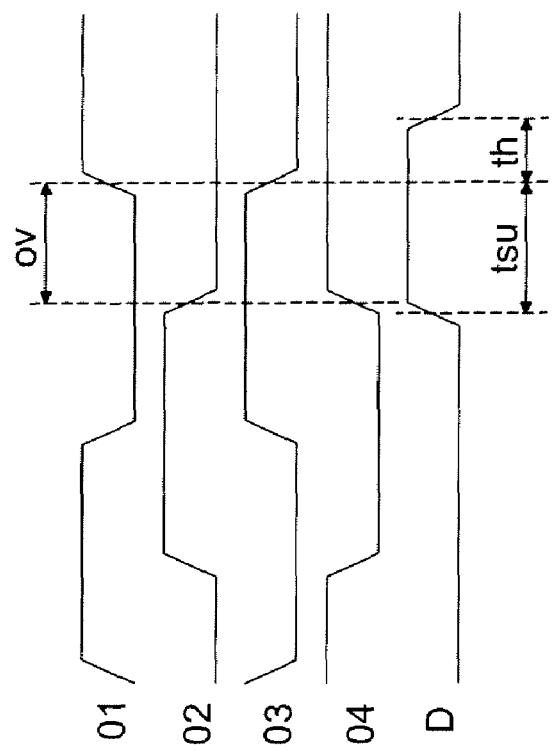
FIGS. 11(a) and 11(b) are a combined timing and logic gate diagram in which the phase skipping situation occurs at the end of the domino datapath between phi3 and a register. In this case, the output of the domino gate is timing critical and therefore it may not be possible to insert a domino buffer in order to fix the problem.
Figure 11A:
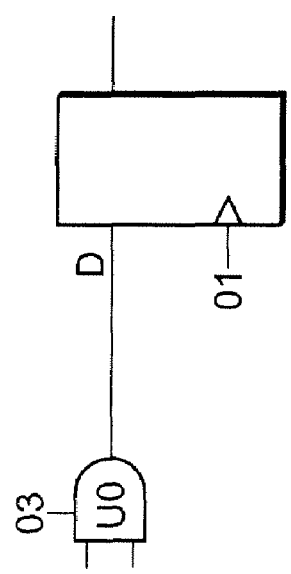

Another situation should also be considered during Step #7. There can be configurations when a phase skipping needs special attention. The most common situation is a single phase skipping between a domino gate and a register, as shown in FIG. 11(a). The timing diagram of FIG. 11(b) shows that, in a worst-case scenario, based on the phase assignment scheme described previously, the timing slack on the register input is defined as:

slack=$ov-tsu-cku-te$, where "ov" is the phase overlap (in our example ¼ period), "tsu" is the register setup constraint, "cku" is the clock uncertainty and "te" the propagation time through the last domino gate. At high frequency (when reaching 1 GHz), this slack tends towards zero. Therefore, inserting an additional level of logic on the path is not an option. In this case, the only solution is to re-assign U0 to Φ4 and possibly have Φ4 arrive earlier. In a single cycle pipeline, and assuming no static signal directly drives a gate on Φ4, the paths captured by the rising edge of Φ4 (precharge paths from Φ3 and Φ4) usually have an abundance of slack and therefore Φ4 can easily be anticipated. In the case shown in FIG. 11, the output of the domino gate is timing critical and therefore it may not be possible to insert a domino buffer in order to fix the problem.

While there have been described above the principles of the present invention in conjunction with a preferred embodiment thereof, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

I claim:

1. An automatic method for assigning the clock phases on a domino datapath embedding static gates in a design comprising:
    replacing domino cells on non-critical paths by static equivalent cells in the design;
    delaying a clock arrival of domino gates having one of their data inputs driven by a static signal in the design;
    ensuring initially that, for each domino gate in the design, a clock input rises before corresponding input data sets;
    ensuring that a downstream domino gate in the design consumes upstream data before it is lost;
    latching evaluated domino values on primary outputs interfacing with static logic before they go to precharge in the design;
    ensuring that the design works at any speed below a maximum operating speed; and
    writing out final outputs of a phase assignment, including a phased design netlist.

2. The method of claim 1 wherein the clock delay is adjusted to ensure that the clock rises some setup time after the static input signal data sets.

3. The method of claim 1 wherein the clock delay is bounded by a phase overlap.

4. The method of claim 1 wherein the clock delay is positive if applied to a clock phase preceding the data, or negative if applied to a clock phase following the data.

5. The method of claim 4 wherein a negative delay on a second clock phase is always chosen over a positive delay on a first clock phase.

6. The method of claim 1 wherein ensuring an initial phase assignment comprises assigning each domino gate in the design to the clock signal that starts immediately before the last data arrives, taking into account clock uncertainty.

7. The method of claim 1 wherein ensuring that a downstream domino gate consumes the upstream data comprises clocking a first level of domino gates in a fanout cone of a domino cell clocked by phase N by phase N or N+1.

8. The method of claim 1 further comprising fixing a phase skipping problem by assigning a domino driver to phase N+1.

9. The method of claim 1 further comprising fixing a phase skipping problem by reverting a static gate to a domino gate and assigning the domino gate to phase N+1.

10. The method of claim 1 further comprising fixing a phase skipping problem by inserting one or more domino buffers completing a phase sequencing starting from phase N+1 on a slow input of a domino gate.

11. The method of claim 1 wherein latching a domino value on the primary output comprises inserting a latch before the primary output and clocking it with a clock phase that precharges the domino value.

12. The method of claim 11 further comprising ensuring that only one precharge can propagate to such a primary output.

13. The method of claim 12 further comprising reverting to domino any static gate driving such a primary output and receiving precharges from different clock phases, and clocking the domino cell with the latest of the precharging clock phases.

14. The method of claim 1 wherein ensuring that the design works at any speed below a maximum operating speed comprises locating pure static combinational cones of logic issued by domino registers and converting a domino output of the register into a static signal by inserting a latch in order to filter out the precharge.

15. The method of claim 1 further comprising performing an evaluation setup check on each domino gate between a data signal rising and a clock signal falling.

16. The method of claim 1 further comprising performing a precharge setup check on each domino gate between a data signal falling and a clock signal rising.

17. The method of claim 1 further comprising performing an evaluate hold check on each domino gate between a clock signal rising and a data signal falling.

18. The method of claim 1 further comprising performing a minimum overlap check on all combinational gates, between any set of ANDed inputs.

19. An automatic method for assigning the clock phases on a domino datapath embedding static gates in a design comprising:

replacing domino cells on non-critical paths by a static equivalent cell in the design;

delaying a clock arrival of domino gates having one of their data inputs driven by a static signal in the design;

ensuring initially that, for each domino gate in the design, a clock input rises before corresponding input data sets;

ensuring that a downstream domino gate in the design consumes upstream data before it is lost;

latching evaluated domino values on primary outputs interfacing with static logic before they go to precharge in the design; and writing out final outputs of a phase assignment, including a phased design netlist.

20. The method of claim 19 further comprising performing a minimum overlap check.

* * * * *